(12) United States Patent
Tsao et al.

(10) Patent No.: US 11,101,190 B2
(45) Date of Patent: Aug. 24, 2021

(54) PACKAGE AND PRINTED CIRCUIT BOARD ATTACHMENT

(71) Applicant: Taiwan Semiconductor Manufacturing Co., Ltd., Hsinchu (TW)

(72) Inventors: Pei-Haw Tsao, Tai-chung (TW); Tsung-Hsing Lu, Jhubei (TW); Li-Huan Chu, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/036,530

(22) Filed: Jul. 16, 2018

(65) Prior Publication Data

US 2020/0020603 A1 Jan. 16, 2020

(51) Int. Cl.
*H01L 23/02* (2006.01)
*H01L 23/31* (2006.01)
*H01L 23/00* (2006.01)
*H01L 23/14* (2006.01)
*H01L 23/498* (2006.01)

(52) U.S. Cl.
CPC ........ *H01L 23/3128* (2013.01); *H01L 23/142* (2013.01); *H01L 23/3114* (2013.01); *H01L 23/49816* (2013.01); *H01L 23/49827* (2013.01); *H01L 24/45* (2013.01)

(58) Field of Classification Search
CPC ... H01L 24/10–17; H01L 24/25; H01L 24/82; H01L 24/24; H01L 24/01; H01L 24/45; H01L 23/3128; H01L 23/142
See application file for complete search history.

(56) References Cited

U.S. PATENT DOCUMENTS

| 7,507,655 | B2 * | 3/2009 | Sakaguchi | ........... B23K 3/0623 438/613 |
| 2013/0228916 | A1 * | 9/2013 | Mawatari | ................ H01L 24/81 257/737 |
| 2014/0113446 | A1 * | 4/2014 | Pendse | .................... H01L 24/97 438/613 |

FOREIGN PATENT DOCUMENTS

| CN | 1585121 A | 2/2005 |
| CN | 103295991 A | 9/2013 |
| JP | 2007027576 A | 2/2007 |

* cited by examiner

*Primary Examiner* — Hoa B Trinh
(74) *Attorney, Agent, or Firm* — Slater Matsil, LLP (57) ABSTRACT

Generally, the present disclosure provides example embodiments relating to a package attached to a printed circuit board (PCB). In an embodiment, a structure includes a PCB. The PCB has ball pads arranged in a matrix. Outer ball pads are along one or more outer edges of the matrix, and each of the outer ball pads has a first solder-attach area. Inner ball pads are interior to the matrix, and each of the inner ball pads has a second solder-attach area. The first solder-attach area is larger than the second solder-attach area.

19 Claims, 7 Drawing Sheets

PACKAGE AND PRINTED CIRCUIT BOARD ATTACHMENT

BACKGROUND

In the electronics industry, generally, integrated circuits are formed on semiconductor dies. The features of the integrated circuits on the semiconductor dies are becoming progressively smaller with advances in semiconductor processing. Semiconductor dies (with integrated circuits) are commonly packaged in packages that contain an interconnect. The interconnect of the package can be formed as an integral part of the package or can be formed independently of other components of the package (such as a package substrate). The interconnect in the package generally provides an interface between the integrated circuit of the semiconductor die and another component. The interconnect in the package can be formed with larger feature sizes, which can be formed with more mature and less expensive technology.

Packages, and possibly other surface mount devices, can then be attached to a printed circuit board (PCB). The PCB can be a substrate to which any number of components are attached to form a system-level device, for example. The PCB can be formed with feature sizes that are even larger than the feature sizes of the interconnect in the package, and hence, can be formed using even more mature and less expensive technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to a package attached to a printed circuit board (PCB). The package and PCB are attached by using solder (e.g., solder balls). The PCB has pads to which the solder is to be attached. The pads are arranged in a matrix, and pads along outer one or more rows and/or columns have a larger area to which the solder is to be attached than pads interior to the matrix. The larger area of the outer pads can reduce a risk of bridging and short circuiting of solder at the outer rows and/or columns (and more particularly, at corners of the matrix). The risk of bridging and short circuiting may result from lateral bulging of the solder due to a reduced height of the solder caused by warpage of the package due to thermal cycling. Other benefits may be achieved.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Figure 1:
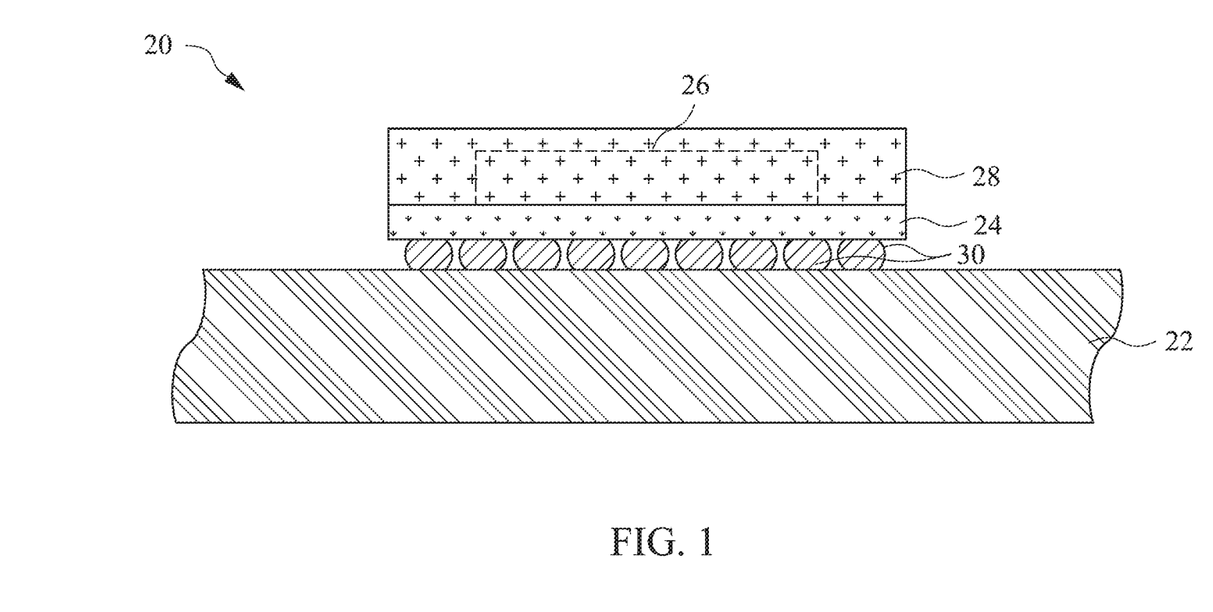
FIG. 1 is a cross-sectional view of a package mechanically attached and electrically coupled to a printed circuit board (PCB) in accordance with some embodiments.

FIG. 1 illustrates a cross-sectional view of a package 20 mechanically attached and electrically coupled to a PCB 22 in accordance with some embodiments. The package 20 includes a package substrate 24 and one or more dies 26 on the package substrate 24. The one or more dies 26 are encapsulated on the package substrate 24 by an encapsulant 28, such as a molding compound.

The package 20 can be any package. As illustrated, the package 20 includes a package substrate 24, but such a package substrate can be omitted in other examples, such as when the package has in integrated interconnect like in an integrated fan-out package. The one or more dies 26, which can include any appropriate integrated circuitry, can be mechanically attached and electrically coupled to the package substrate 24 by any suitable technique. For example, the one or more dies 26 can be mechanically attached and electrically coupled to the package substrate 24 using flip chip technology. Controlled collapse chip connects (C4) can be implemented on the one or more dies 26 and can be used to attach the one or more dies 26 to the package substrate 24. In another example, the one or more dies 26 can be mechanically attached to the package substrate 24 by an adhesive and can be electrically coupled to the package substrate 24 by wire bonding. Any other technology can be used to mechanically attach and electrically couple the one or more dies 26 to the package substrate 24. If more than one die 26 is included in the package 20, any combination of technologies, e.g., flip chip, wire bonding, etc., can be implemented to mechanically attach and electrically couple the dies 26 to the package substrate 24.

After the one or more dies 26 are mechanically attached and electrically coupled to the package substrate 24, the one or more dies 26 are encapsulated on the package substrate 24. In some examples, the one or more dies 26 are encapsulated by a molding compound using compression molding, transfer molding, or another molding process.

The package substrate 24 includes a number of metal layers that include vias and lines that route interconnections. The package substrate 24 can redistribute and/or interconnect various signals and/or components through the vias and/or lines of the metal layers. Additional details of example package substrates are described below.

The package 20 is mechanically attached and electrically coupled to the PCB 22 by solder balls 30. The solder balls 30 are or include a lead-free solder, such as tin, silver, copper (Sn—Ag—Cu or SAC) solder, or another solder. Solder can be formed on pads of the package substrate 24, such as by printing, plating, evaporation, or another process. The package 20 can be placed on the PCB 22 such that the solder aligns with respective pads on the PCB 22, and a reflow process can be performed to reflow the solder thereby forming the solder balls 30 that attach the package 20 to the PCB 22. Multiple packages can be mechanically attached and electrically coupled to the PCB 22.

The PCB 22 includes multiple metal layers that each includes lines, which may be interconnected between layers by through-hole connectors. The PCB 22 can redistribute and/or interconnect various signals and/or components through the through-hole connectors and/or lines. The PCB 22 with various packages attached thereto may implement a system or portion thereof. Additional details of example PCBs are described below.

Figure 2:
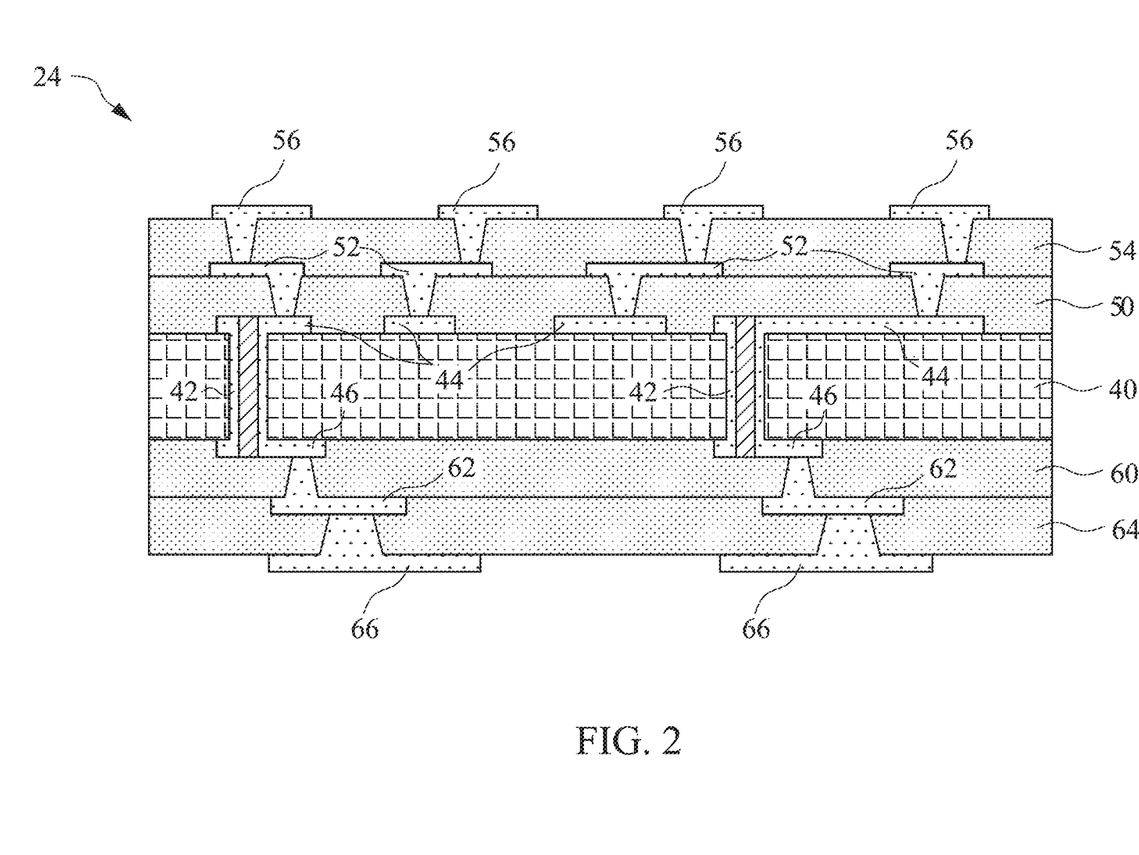
FIG. 2 is a cross-sectional view of a portion of the package substrate in accordance with some embodiments.

FIG. 2 illustrates a cross-sectional view of a portion of the package substrate 24. The package substrate 24 includes a core 40. The core 40 provides mechanical strength and rigidity for the package substrate 24. The core 40, in some embodiments, is or includes a layer of pre-preg (e.g., a fiberglass matrix injected with an epoxy resin, such as FR-4). The layer of pre-preg can have a metal foil (e.g., copper foil) on opposing sides. Through-holes can be formed through the layer of pre-preg and plated with a metal (e.g., copper) to form through-hole connectors 42. The metal foil on the opposing sides can be etched using photolithography and etch processes to form metal lines on the opposing sides. Hence, the core 40 can include through-hole connectors 42 electrically coupled to various metal lines 44, 46 on opposing sides of the core 40.

Various levels of insulating layers and metal layers are then formed on the core 40. For convenience, "front-side" is used herein to designate the side of the core 40 on which the one or more dies 26 are to be attached, and "back-side" is used herein to designate the side of the core 40 opposite from the front-side.

As illustrated, a first front-side insulating layer 50 is formed on the core 40 and metal lines 44. The first front-side insulating layer 50, in some examples, is an Ajinomoto Build-up Film (ABF) or the like, and is laminated or formed by another process on the core 40 and metal lines 44. Via openings are formed through the first front-side insulating layer 50 to underlying metal lines 44 using laser drilling, for example. A metal seed layer is formed on the first front-side insulating layer 50, such as by using physical vapor deposition (PVD), and a photoresist is formed and patterned over the metal seed layer. A plating process (such as electroless or electroplating) is performed to form metal lines 52 and vias (not individually numbered) to connect the metal lines 52 with the underlying metal lines 44. The photoresist is then removed, such as by using a wet stripping process, and the exposed metal seed layer is removed, such as by a wet etching process. The metal seed layer can be or include copper, titanium, another metal, or a combination thereof, and the metal lines 52 and vias can be or include copper, another metal, or a combination thereof. A second front-side insulating layer 54 and die-connection pads 56 with vias are formed on the first front-side insulating layer 50 and metal lines 52. The second front-side insulating layer 54 and die-connection pads 56 with vias can be formed using the same processes as described with respect to the first front-side insulating layer 50 and metal lines 52 with vias. The die-connection pads 56 can be configured and arranged according to how the one or more dies 26 are to be attached to the package substrate 24. For example, the die-connection pads 56 can be configured and arranged to accommodate flip chip connections, wire bonding, or other connections.

A first back-side insulating layer 60 is formed on the core 40 and metal lines 46. Metal lines 62 and vias (not individually numbered) are formed to connect the metal lines 62 with the underlying metal lines 46. The first back-side insulating layer 60 and metal line 62 with vias can be formed using the same processes as described with respect to the first front-side insulating layer 50 and metal lines 52 with vias. A second back-side insulating layer 64 and ball pads 66 with vias are formed on the first back-side insulating layer 60 and metal lines 62. The second back-side insulating layer 64 and ball pads 66 with vias can be formed using the same processes as described with respect to the first front-side insulating layer 50 and metal lines 52 with vias. The ball pads 66 can be configured and arranged according to a ball grid array (BGA) matrix, for example, on which the solder balls 30 can be formed.

The one or more dies 26 can be attached to the package substrate 24 at various times of forming the package substrate 24. For example, the one or more dies 26 can be attached (such as by flip chip connections, wire bonding, etc.) on the front-side of the package substrate 24 after back-side processing (e.g., forming back-side insulating layers 60, 64, metal lines 62, and ball pads 66) is performed. In other examples, the one or more dies 26 can be attached on the front-side of the package substrate 24 before back-side processing is performed. In such examples, the one or more dies 26 can be attached on the front-side of the package substrate 24 and encapsulated by the encapsulant 28 (such as described above) before back-side processing is performed.

The package substrate 24 is merely an example. Any number of insulating layers and metal layers including metal lines and vias can be formed on the front-side and/or the back-side of the core. In some examples, package substrates can omit a core and any associated components. A package substrate can be formed by any process according to any technology.

Figure 3:
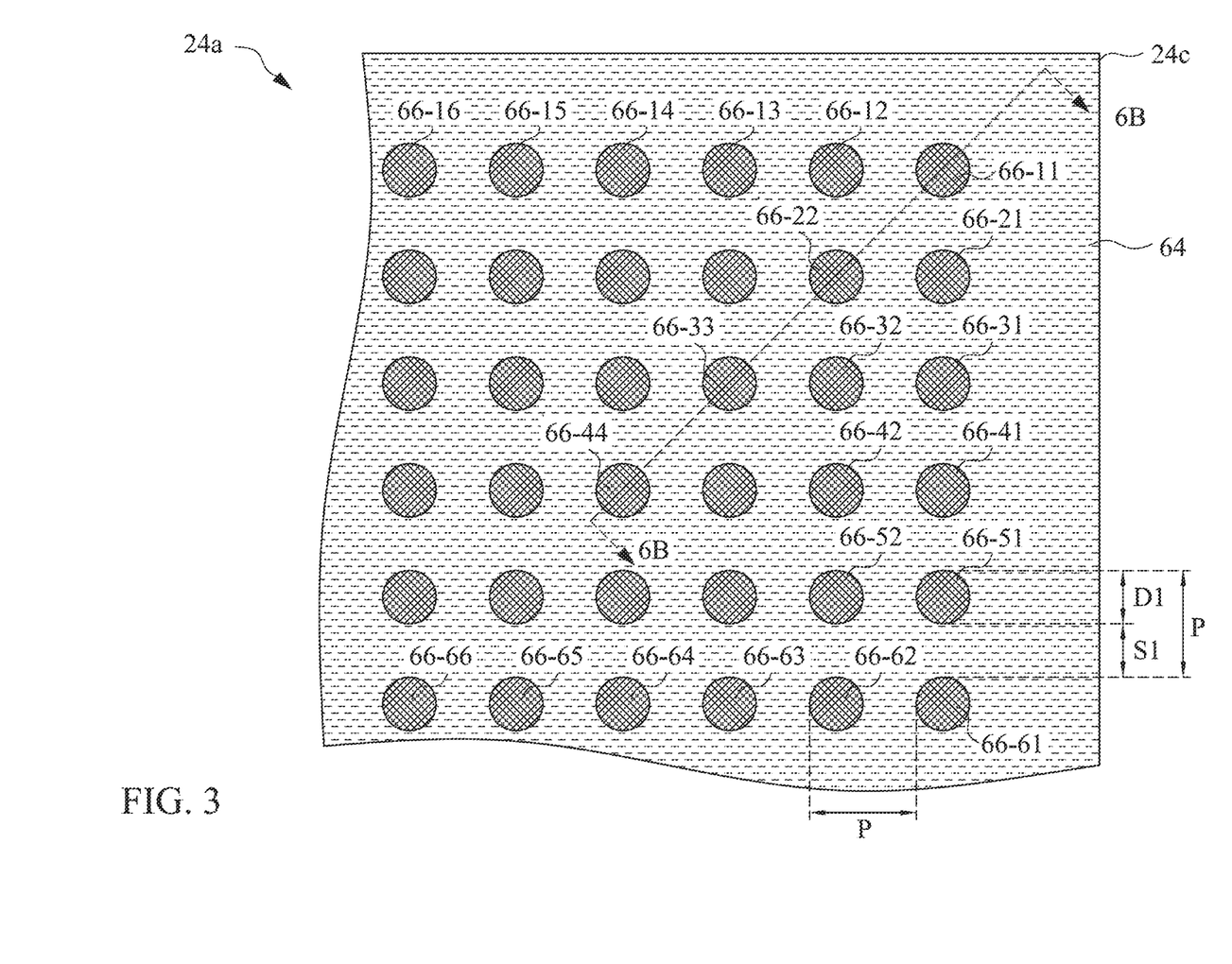
FIG. 3 is a layout view of a corner portion of the package substrate in accordance with some embodiments.

FIG. 3 illustrates a layout view of a corner portion 24a of the package substrate 24 in accordance with some embodiments. In some examples, a layout of the package substrate 24 is rectangular, such as a square or rectangle. In such examples, the corner portion 24a is representative of each of the four corners in the layout of the package substrate 24. In the layout, ball pads 66 are arranged in a matrix comprising rows (as referenced herein, x number of rows) and columns (as referenced herein, y number of columns). Although not necessarily illustrated, the matrix can include ball pads 66 throughout the area of the matrix according to the rows and columns, or can omit ball pads in some locations, such as in a center area of the layout of the package substrate 24. As illustrated, the matrix includes rows of ball pads 66, where a first row includes ball pads 66-1j, a second row includes ball pads 66-2j, a third row includes ball pads 66-3j, etc. (where j is 1 to y). The matrix includes columns of ball pads 66, where a first column includes ball pads 66-i1, a second column includes ball pads 66-i2, a third column includes ball pads 66-i3, etc. (where i is 1 to x). A pitch P between neighboring ball pads 66 along a row or along a column can be in a range from about 200 µm to about 1000 µm, such as about 1000 µm. As illustrated in FIG. 3, the pitch P is between ball pads 66-51 and 66-61 in a column, and is between ball pads 66-61 and 66-62 in a row. The ball pads 66 have a first diameter D1, and have a first spacing S1 between neighboring ball pads 66 along a row or along a column. The first diameter D1 plus the first spacing S1 is equal to the pitch P. The first diameter D1 can be in a range from about 100 µm to about 600 µm, such as about 500 µm, and the first spacing S1 can be in a range from about 100 µm to about 500 µm, such as about 500 µm. Although described as having a diameter and being illustrated as circular, the ball pads 66 can have any geometry, such as any polygon.

In the examples where the layout of the package substrate 24 is rectangular, the outer rows of the matrix of ball pads 66 (e.g., ball pads 66-1j and 66-xj) and outer columns of the matrix of ball pads 66 (e.g., ball pads 66-i1 and 66-iy) also form a rectangular shape. Hence, the matrix of ball pads 66 includes four corner ball pads 66-11, 66-1y, 66-x1, and 66-xy. Each of the respective four corner ball pads 66-11, 66-1y, 66-x1, and 66-xy is the respective ball pad 66 closest to a corner of the layout of the package substrate 24. For example, as illustrated, the corner ball pad 66-11 is the ball pad 66 of the matrix closest to the corner 24c of the layout of the package substrate 24.

Figure 6A:
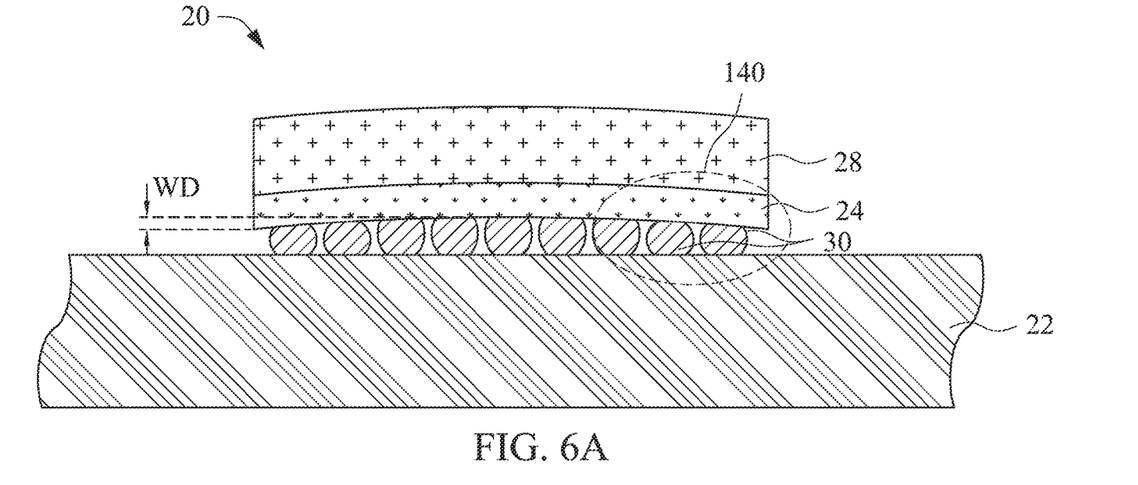
FIGS. 6A and 6B are cross-sectional views of the package mechanically attached and electrically coupled to the PCB in accordance with some embodiments.
Figure 6B:
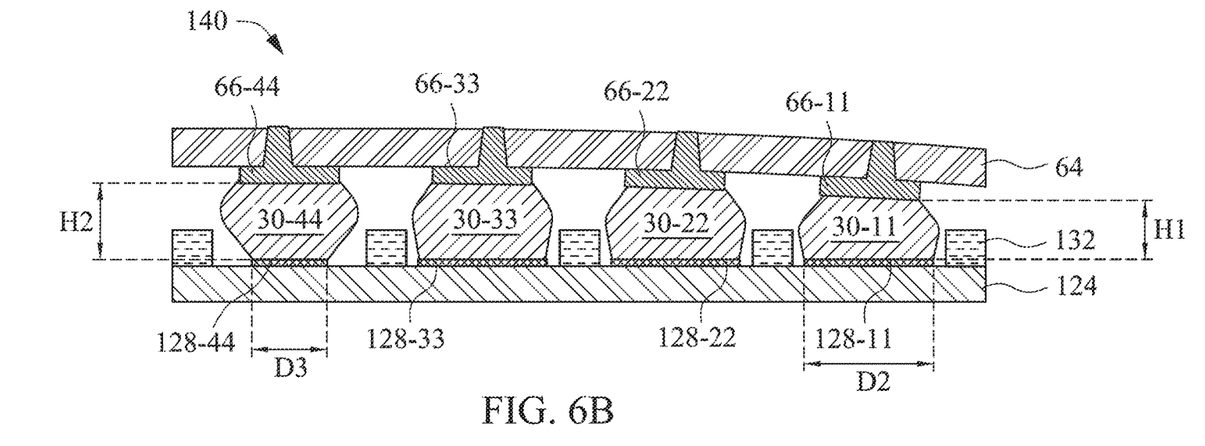

FIG. 3 further illustrates a cross-section 6B that is illustrated in further detail in FIG. 6B. The cross-section 6B is across ball pads 66-11, 66-22, 66-33, and 66-44.

Figure 4:
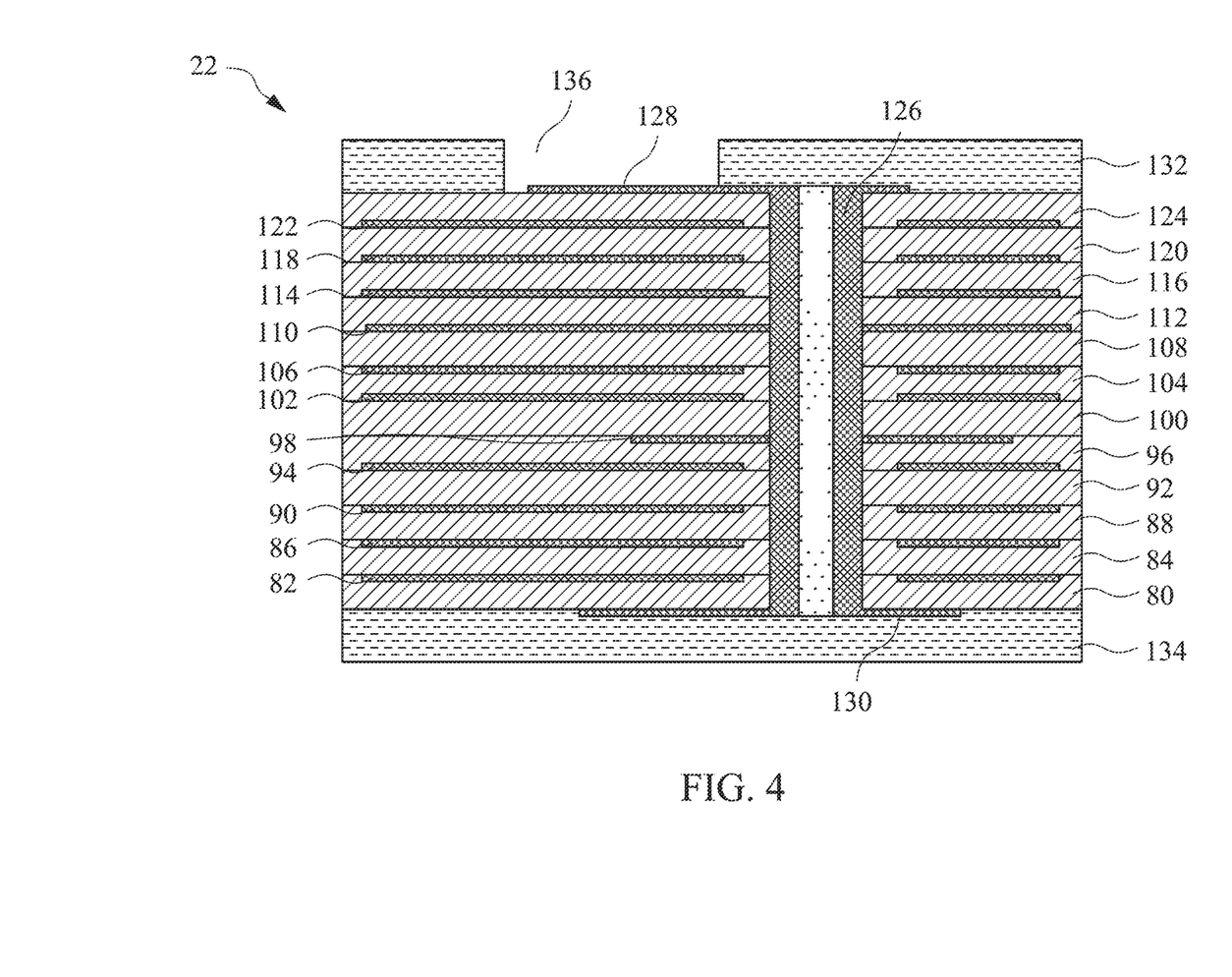
FIG. 4 is a cross-sectional view of a portion of the PCB in accordance with some embodiments.

FIG. 4 illustrates a cross-sectional view of a portion of the PCB 22 in accordance with some embodiments. The PCB 22 includes a number of insulating layers 80, 84, 88, 92, 96, 100, 104, 108, 112, 116, 120, and 124 and a number of metal layers. The various metal layers as illustrated include metal lines 82, 86, 90, 94, 98, 102, 106, 110, 114, 118, and 122. In some examples, the PCB 22 includes ten to thirty different insulating layers with a metal layer disposed between each neighboring pair of insulating layers.

In some examples, each of the insulating layers 80, 84, 88, 92, 96, 100, 104, 108, 112, 116, 120, and 124 of the PCB 22 is or includes a layer of pre-preg (e.g., a fiberglass matrix injected with an epoxy resin, such as FR-4). The layer of pre-preg can initially have a metal foil (e.g., copper foil) on one or both opposing sides. Each metal foil is patterned into the corresponding metal lines 82, 86, 90, 94, 98, 102, 106, 110, 114, 118, and 122 using photolithography and etch processes. After the metal foils are patterned to form corresponding metal lines, the insulating layers are joined together. The insulating layers are aligned and pressed together to bond the insulating layers.

After the insulating layers are joined, through-hole connectors 126 are formed through the insulating layers. Holes can be formed through the joined insulating layers using drilling, for example. After forming the holes, the joined insulating layers may be plated with a metal (e.g., copper and/or tin). The plating forms the through-hole connectors 126 in the holes and can also form a metal layer on the exterior surfaces of the joined insulating layers. The metal layers on the exterior surfaces are patterned. On an exterior surface, ball pads 128 with metal lines connecting the ball pads 128 to the through-hole connectors 126 are patterned. On another exterior surface, metal lines 130 or other patterns are patterned. The patterning of the ball pads 128 with metal lines and/or the metal lines 130 on the exterior surfaces can be implemented by photolithography and etching processes, and/or a photolithography process and the plating that deposits the metal.

Solder masks (or solder resists) 132 and 134 are formed on respective exterior surfaces of the joined insulating layers. The solder masks 132 and 134 can be patterned to expose an underlying metal pattern. For example, as illustrated, the solder mask 132 is patterned, using a photolithography process, to define openings 136 that expose the ball pads 128.

Figure 5:
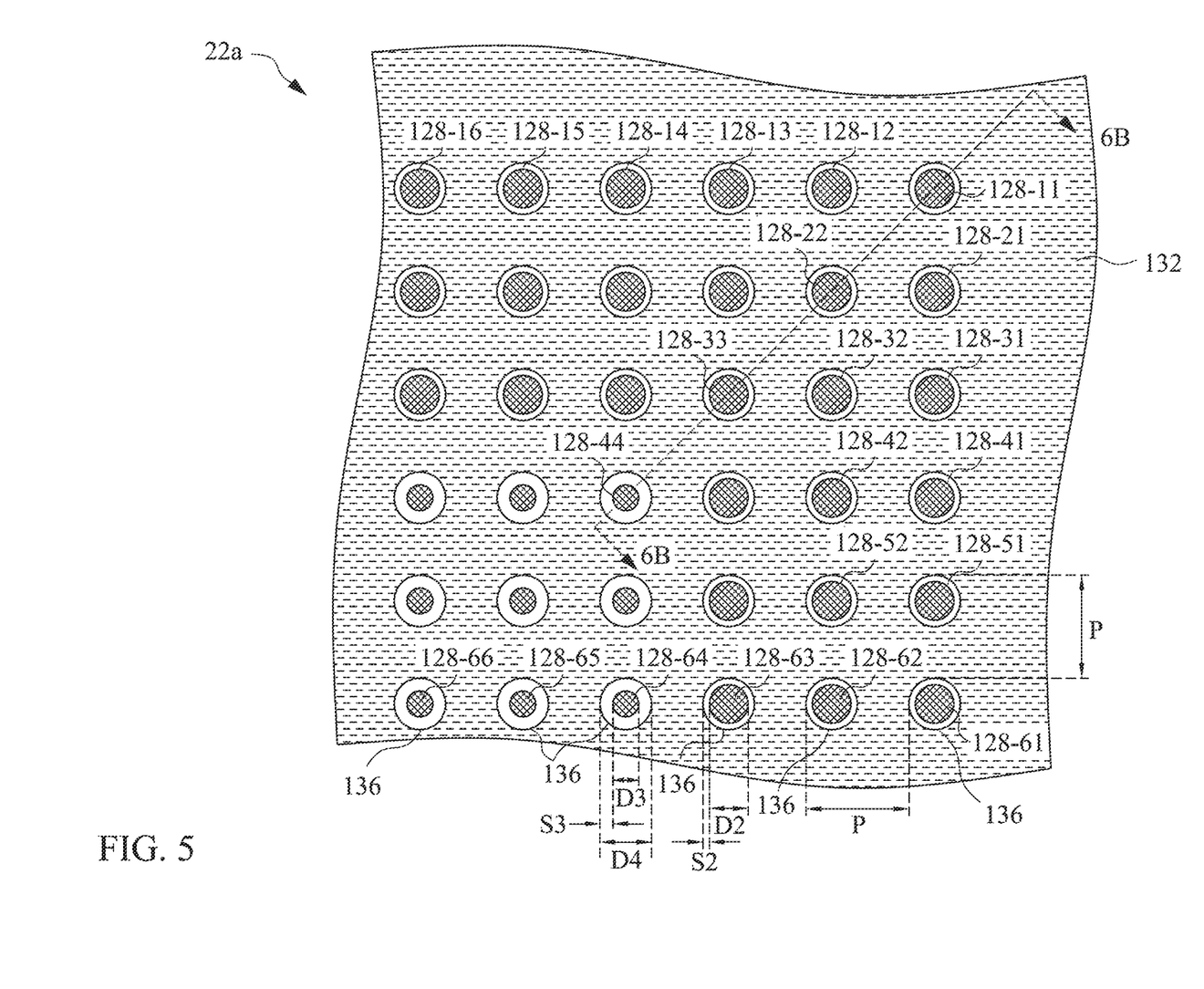
FIG. 5 is a layout view of a portion of the PCB in accordance with some embodiments.

FIG. 5 illustrates a layout view of a portion 22a of the PCB 22 in accordance with some embodiments. In the layout, ball pads 128 are arranged in a matrix comprising rows (as referenced herein, x number of rows) and columns (as referenced herein, y number of columns). The matrix of ball pads 128 corresponds to the matrix of ball pads 66 on the package substrate 24. Although not necessarily illustrated, the matrix can include ball pads 128 throughout the area of the matrix according to the rows and columns, or can omit ball pads in some locations, such as in a center area of the layout of the matrix. As illustrated, the matrix includes rows of ball pads 128, where a first row includes ball pads 128-1j, a second row includes ball pads 128-2j, a third row includes ball pads 128-3j, etc. (where j is 1 to y). The matrix includes columns of ball pads 128, where a first column includes ball pads 128-i1, a second column includes ball pads 128-i2, a third column includes ball pads 128-i3, etc. (where i is 1 to x). Each ball pad 128 is exposed through a respective opening 136 through the solder mask 132. The pitch P is between neighboring ball pads 128 and/or openings 136 along a row or along a column.

Ball pads 128 along outer one or more rows and columns have a larger diameter than ball pads 128 interior to the matrix of ball pads 128. As a result, the ball pads 128 along the outer rows and columns have a larger area than ball pads 128 interior to the matrix of ball pads 128. In some examples, each of the ball pads 128 along the outer one or more rows and columns has an area that is in a range from about 10% to 50% larger than an area of each ball pad 128 interior to the matrix. As illustrated in FIG. 5, the outer three rows (e.g., ball pads 128-1j, 128-2j, 128-3j, 128-(x−2)j, 128-(x−1)j, and 128-xj) and outer three columns (e.g., ball pads 128-i1, 128-i2, 128-i3, 128-i(y−2), 128-i(y−1), and 128-iy) along the periphery of the matrix have the larger diameter and area. In other examples, any number of outer rows and outer columns of ball pads 128 along each edge of the matrix may be implemented to have a larger diameter and area than interior ball pads 128. For example, in some embodiments, one to five outer rows and columns along each edge of the matrix may be implemented to have a larger diameter and area than interior ball pads 128. Although illustrated and described as the number of rows equaling the number of columns, in other examples, the number of outer rows having the larger diameter and area may differ from the number of outer columns having the larger diameter and area.

The larger ball pads 128 (e.g., ball pads 128-1j, 128-i1, etc.) have a second diameter D2, and the smaller ball pads 128 (e.g., ball pads 128-64, etc.) have a third diameter D3. Each of the openings 136 has a fourth diameter D4. The fourth diameter D4 is greater than each of the second diameter D2 and the third diameter D3. In some examples, the second diameter D2 is in a range from about 110 μm to about 600 μm, such as about 600 μm; the third diameter D3 is in a range from about 100 μm to about 550 μm, such as about 525 μm; and the fourth diameter D4 is in a range from about 130 μm to about 650 μm, such as about 650 μm. Although described as having a diameter and being illustrated as circular, the ball pads 128 can have any geometry, such as any polygon.

First gaps are defined between the edges of larger ball pads 128 and respective sidewalls of the openings 136. The first gaps have a second spacing S2 between the edge of the ball pad 128 and the sidewall of the opening 136. Second gaps are defined between the edges of smaller ball pads 128 and respective sidewalls of the openings 136. The second gaps have a third spacing S3 between the edge of the ball pad 128 and the sidewall of the opening 136. The third spacing S3 is larger than the second spacing S2. In some examples, the second spacing S2 is in a range from about 15 μm to about 30 μm, such as about 25 μm, and the third spacing S3 is in a range from about 20 μm to about 50 μm, such as about 50 μm. In other examples, the openings 136 can have varying diameters, and/or the spacing of gaps formed in the openings 136 can be equal or vary throughout the matrix. Although described as having a diameter and being illustrated as circular, the openings 136 can have any geometry, such as any polygon.

As illustrated and described the ball pads 128 are non-solder mask defined pads. The openings 136, as illustrated, are larger than the areas of the ball pads 128, which forms the first and second gaps between the edges of the ball pads 128 and the sidewalls of the opening 136. In other examples, the ball pads may be solder mask defined pads. In such examples, the ball pads throughout the matrix may or may not have a same diameter and area. In such examples, openings through the solder mask 132 may differ in diameter such that areas of ball pads exposed through the opening to which solder balls may be formed also differ in diameter. For example, openings 136 along outer rows and columns of the matrix can have a larger diameter than openings 136 interior to the matrix. The openings 136 define the areas of the ball pads on which the solder balls are to be formed, and hence, exposed areas of ball pads along the outer rows and columns are larger than exposed areas of ball pads interior to the matrix.

FIG. 5 further illustrates a cross-section 6B that is illustrated in further detail in FIG. 6B. The cross-section 6B is across ball pads 128-11, 128-22, 128-33, and 128-44.

FIGS. 6A and 6B illustrate cross-sectional views of the package 20 mechanically attached and electrically coupled to the PCB 22 in accordance with some embodiments. FIG. 6B illustrates a corner portion 140 shown in FIG. 6A. FIGS. 6A and 6B illustrate the package 20 and PCB 22 after thermal cycling, such as after a reflow process to reflow the solder balls 30. In some examples, a coefficient of thermal expansion (CTE) of the encapsulant 28 (e.g., molding compound) and/or other components on the package substrate 24 is greater than a CTE of the package substrate 24. Hence, when the package 20 is heated during a reflow process, the encapsulant 28 and/or other components can expand a greater amount than the package substrate 24. The difference in the amount of expansion can cause warpage of the package 20. As illustrated, when the encapsulant 28 and/or other components expand a greater amount than the package substrate 24, a bottom surface of the package substrate 24 (e.g., to which the solder balls 30 are attached) can become concave. Locations in the package 20 farthest from a center of the package 20 can experience a greatest warpage deflection WD. For example, when a layout of the package 20 is rectangular, such as described above, corners of the layout are generally the locations in the package 20 farthest from the center of the package 20, and hence, a greatest warpage deflection WD can be observed at the corners. Even further, the larger the layout of the package 20 is (such as for a 50 mm×50 mm layout), the larger the warpage deflection WD can become.

When the warpage deflection WD occurs during reflowing of the solder balls 30, a volume available to outer solder balls, and more particularly, solder balls 30 at the corners, to flow can be decreased. The warpage deflection WD can cause a height between ball pads 66 on the package substrate 24 and ball pads 128 on the PCB 22 to decrease. Assuming that the ball pads 66 on the package substrate 24 have a same attachment area and pitch and that the ball pads 128 on the PCB 22 have a same attachment area and pitch, solder balls 30 at the corners risk laterally bulging to accommodate the reduced height due to warpage. This bulging can cause bridging and short circuiting between solder balls 30.

According to some embodiments, the attachment area of the ball pads 128 is larger along outer rows and columns in the layout of the matrix of ball pads 128 on the PCB 22. The larger attachment area can provide a larger wetting surface for the solder balls 30 attached to those ball pads 128. The larger wetting surface on the ball pads 128 along the outer rows and columns permits an accommodation in volume to offset a reduced height due to warpage of the package 20. The accommodation in volume can reduce lateral bulge of the solder balls 30 along the outer rows and columns, which can reduce a risk of bridging and short circuiting.

FIG. 6B illustrates some components illustrated in the layout views of FIGS. 3 and 5. More specifically, FIG. 6B illustrates ball pads 66-11, 66-22, 66-33, and 66-44 on the package substrate 24 shown in FIG. 3 and ball pads 128-11, 128-22, 128-33, and 128-44 on the PCB 22 shown in FIG. 5. Corresponding solder balls 30-11, 30-22, 30-33, and 30-44 are attached to the ball pads 66-11, 66-22, 66-33, and 66-44 and the ball pads 128-11, 128-22, 128-33, and 128-44. The ball pads 66-11, 66-22, and 66-33, and ball pads 128-11, 128-22, and 128-33 are in the three outer rows/columns of the matrix as illustrated in FIGS. 3 and 5, and the ball pad 66-44 and ball pad 128-44 are interior to the three outer rows/columns as illustrated in FIGS. 3 and 5. As previously described, the ball pads 128-11, 128-22, and 128-33 have the second diameter D2, while the ball pad 128-44 has the third diameter D3, which is less than the second diameter D2. The second diameter D2 permits the ball pads 128-11, 128-22, and 128-33 to have a greater area, and hence, a greater wetting surface, than the ball pad 128-44 with the third diameter D3.

FIG. 6B further illustrates a first height H1 of the solder ball 30-11 in an outer column of the matrix and a second height H2 of the solder ball 30-44 in an interior of the matrix. The first height H1 is less than the second height H2. The difference between the first height H1 and the second height H2 can be the result of warpage. As illustrated, the larger second diameter D2 of the ball pad 128-11 can accommodate the reduced first height H1 of the solder ball 30-11 relative to the smaller third diameter D3 of the ball pad 128-44 and the second height H2 of the solder ball 30-44. Hence, lateral bulge and short circuiting of solder balls 30-11, 30-22, and 30-33 can be reduced.

Figure 7:
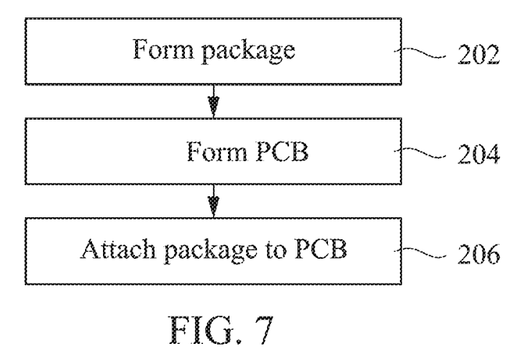
FIG. 7 is a flow chart for forming a package attached to a PCB in accordance with some embodiments.

FIG. 7 is a flow chart for forming a package attached to a PCB in accordance with some embodiments. In operation 202, a package is formed, such as to be described subsequently with reference to FIG. 8. In operation 204, a PCB is formed, such as to be described subsequently with reference to FIG. 9. In operation 206, the package is attached to the PCB. For example, solder can be formed on ball pads on the package and/or the PCB. The package can be placed on the PCB and aligned such that the ball pads on the package aligns with appropriate ball pads on the PCB with the solder disposed therebetween. The solder is then reflowed to form a more permanent mechanical and electrical attachment between the ball pads of the package and the ball pads of the PCB.

Figure 8:
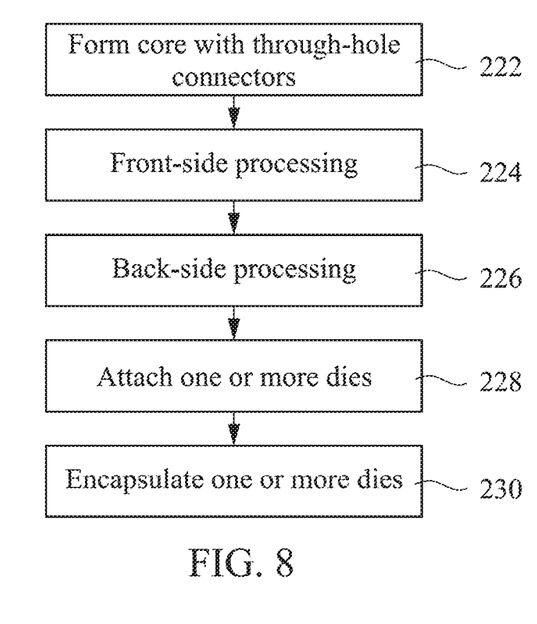
FIG. 8 is a flow chart for forming a package in accordance with some embodiments.

FIG. 8 is a flow chart for forming a package in accordance with some embodiments. In operation 222, a core is formed with through-hole connectors. The core can be formed as described above with respect to FIG. 2. In operation 224, front-side processing is performed to form one or more insulating layers with one or more metal layers on the front-side of the core. Any number of insulating layers and metal layers may be formed on the front-side as described above with respect to FIG. 2. In operation 226, back-side processing is performed to form one or more insulating layers with one or more metal layers on the back-side of the core. Any number of insulating layers and metal layers may be formed on the back-side as described above with respect to FIG. 2. The insulating layers on the front-side and back-side, the metal layers disposed in the insulating layers, and the core form a package substrate. In operation 228, one or more dies are attached to the front-side of the package substrate, such as described above with respect to FIG. 2. In operation 230, the one or more dies are encapsulated on the front-side of the package substrate. For example, an encapsulant, such as a molding compound, may be used to encapsulate the one or more dies, such as by using compression molding, transfer molding, or another molding process.

Figure 9:
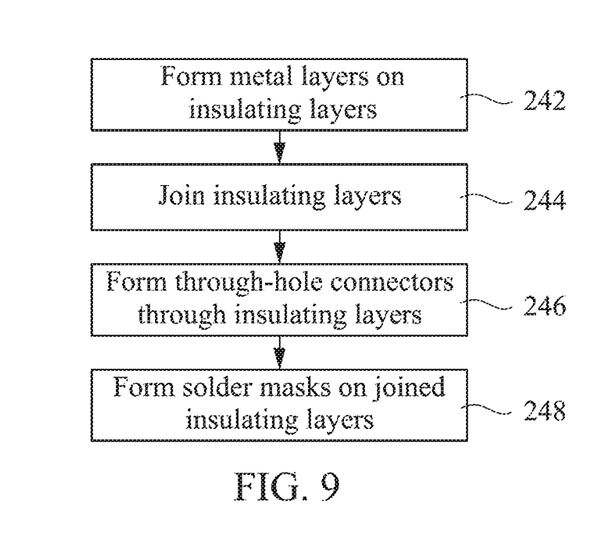
FIG. 9 is a flow chart for forming a PCB in accordance with some embodiments.

FIG. 9 is a flow chart for forming a PCB in accordance with some embodiments. In operation 242, metal layers are formed on insulating layers. The metal layers (e.g., with patterned metal lines) can be formed on the insulating layers as described above with respect to FIG. 4. In operation 244, the insulating layers with the metal layers can be joined together, such as described above with respect to FIG. 4. In operation 246, through-hole connectors are formed through the joined insulating layers, such as described above with respect to FIG. 4. The forming of the through-hole connectors may further form metal layers on exterior surfaces of the joined insulating layers. In operation 248, solder masks are formed on the exterior surfaces and are patterned to expose ball pads.

Some embodiments can achieve advantages. For example, as described above, a risk of bridging and short circuiting of solder balls in outer rows and columns of a matrix can be reduced, which can increase yield of packages attached to PCBs. Further, in other configurations, no solder balls were formed proximate corner portions of a layout of a package (e.g., depopulation in the corner portions) due to the associated risk of bridging and short circuiting. In some embodiments, solder balls may be formed in corner portions of a layout of a package, which can increase the number of inputs and/or outputs from the package.

An embodiment is a structure. The structure includes a printed circuit board (PCB). The PCB has ball pads arranged in a matrix. Outer ball pads are along one or more outer edges of the matrix, and each of the outer ball pads has a first solder-attach area. Inner ball pads are interior to the matrix, and each of the inner ball pads has a second solder-attach area. The first solder-attach area is larger than the second solder-attach area.

Another embodiment is a structure. The structure includes a package, a printed circuit board (PCB), and solder balls. The package has first solder ball pads arranged in a first matrix. A layout of the package is a first rectangular shape. The first matrix of the first solder ball pads has outer edges in a second rectangular shape. Each corner of the second rectangular shape of the first matrix of the first solder ball pads is disposed proximate a respective corner of the first rectangular shape of the layout of the package. The PCB has second solder ball pads arranged in a second matrix corresponding to the first matrix. A respective corner solder ball pad is at each corner of the second matrix of the second solder ball pads. An interior solder ball pad is interior to the second matrix of the second solder ball pads. The solder balls are mechanically attached to the first solder ball pads and the second solder ball pads. Each corner solder ball pad has a first area to which a respective corner one of the solder balls is attached. The interior solder ball pad has a second area to which an interior one of the solder balls is attached. The first area is greater than the second area.

A further embodiment is a method. A package is attached to a printed circuit board (PCB). The attaching includes reflowing solder balls. After reflowing the solder balls, each of the solder balls is attached to a respective one of first pads on the package and to a respective one of second pads on the PCB. The second pads are arranged in a matrix on the PCB. A first one of the second pads is disposed at a corner of the matrix, and a second one of the second pads is disposed interior in the matrix. The first one of the second pads has a first area to which a respective one of the solder balls is attached, and the second one of the second pads has a second area to which a respective one of the solder balls is attached. The first area is greater than the second area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a printed circuit board (PCB) having ball pads arranged in a matrix, outer ball pads being along one or more outer edges of the matrix, each of the outer ball pads having a first solder-attach area, inner ball pads being interior to the matrix, each of the inner ball pads having a second solder-attach area, the first solder-attach area being larger than the second solder-attach area; and
   a solder mask having openings therethough, wherein each of the openings that exposes a respective one of the outer ball pads has a first spacing between an edge of the respective one of the outer ball pads and a sidewall of the solder mask that defines the respective opening, and each of the openings that exposes a respective one of the inner ball pads has a second spacing between an edge of the respective one of the inner ball pads and a sidewall of the solder mask that defines the respective opening; and the second spacing is larger than the first spacing.

2. The structure of claim 1, wherein the outer edges of the matrix form a rectangular shape.

3. The structure of claim 1, wherein the outer ball pads are within a number of outer rows and outer columns, each of the outer rows and the outer columns being parallel to a corresponding one of the outer edges of the matrix, the number being in a range from one to five.

4. The structure of claim 1, wherein the first solder-attach area is in a range from 10% to 50% larger than the second solder-attach area.

5. The structure of claim 1, wherein the openings that expose the inner ball pads and the outer ball pads each have a same lateral opening dimension.

6. The structure of claim 1, wherein the first solder-attach area of each of the respective outer ball pads and the second solder-attach area of each of the inner ball pads are not defined by the solder mask.

7. The structure of claim 1 further comprising:
a package; and
solder balls, each of the solder balls being attached to a respective one of (i) the first solder-attach area of one of the outer ball pads and (ii) the second solder-attach area of one of the inner ball pads, each of the solder balls further being attached to the package.

8. A structure comprising:
a package having a first plurality of solder ball pads, each solder ball pad of the first plurality being of a same diameter;
a printed circuit board (PCB) having a second plurality of solder ball pads, each solder ball pad of the second plurality corresponding to a solder ball pad of the first plurality, the second plurality including corner solder ball pads adjacent respective corners of the PCB, and including interior solder ball pads in the interior of the second plurality, the respective corner solder ball pads being larger than the respective interior solder ball pads;
solder balls mechanically attached to the first plurality of solder ball pads and the second plurality of solder ball pads, each corner solder ball pad having a first area to which a respective one of the solder balls is attached, each interior solder ball pad having a second area to which one of the solder balls is attached, the first area being greater than the second area, wherein all of the solder balls has a same material composition and same melting temperature; and
a solder mask having openings respectively exposing the solder ball pads, wherein respective first gaps between the respective openings and the respective interior solder ball pads are greater than respective second gap between the respective openings and the respective corner solder ball pads.

9. The structure of claim 8, wherein the first area is in a range from 10% to 50% larger than the second area.

10. The structure of claim 8, wherein a height of each solder ball attached to a corner solder ball pad is greater than a height of each solder ball attached to an interior solder ball pad.

11. The structure of claim 8, wherein the corner solder ball pads are arranged in rows and columns running parallel to respective outer edges of the second plurality.

12. The structure of claim 8, wherein the PCB includes a solder mask, openings being through the solder mask, each of the second solder ball pads being exposed by a respective one of the openings.

13. The structure of claim 12, wherein the openings that expose the second solder ball pads each have a same lateral opening dimension.

14. The structure of claim 12, wherein the first area of the respective corner solder ball pads and the second area of the respective interior solder ball pads are not defined by the solder mask.

15. A structure comprising:
a package electronically bonded to a printed circuit board (PCB) by way of solder balls, wherein each of the solder balls is attached to a respective one of first pads on the package and to a respective one of second pads on the PCB, the second pads being arranged in a matrix on the PCB, the second pads including a corner pad disposed at a corner of the matrix, and an interior pad disposed interior in the matrix, the corner pad having a first area to which a respective one of the solder balls is attached and being solder connected to one of the first pads, the interior pad having a second area to which a respective one of the solder balls is attached and being solder connected to a different one of the first pads, the first area being greater than the second area, the first pads being arranged in a matrix on the package, all of the first pads on the package having a same third area.

16. The structure of claim 15, wherein the first area is in a range from 10% to 50% greater than the second area.

17. The structure of claim 15, wherein the second pads in one to five outer rows of the matrix and the second pads in one to five outer columns of the matrix each have the first area to which respective ones of the solder balls are attached.

18. The structure of claim 15, wherein the solder connecting the corner pad to one of the first pads is a same material composition and same melting temperature as the solder connecting the interior pad to a different one of the first pads.

19. The structure of claim 15, further comprising:
a solder mask on the PCB and including:
a first opening that exposes the first one of the second pads with a first spacing between an edge of the first one of the second pads and a sidewall of the opening, and
a second opening that exposes the second one of the second pads with a second spacing between an edge of the second one of the second pads and a sidewall of opening,
wherein the second spacing is larger than the first spacing.

* * * * *